(12) United States Patent
Inukai et al.

(10) Patent No.: US 7,490,018 B2
(45) Date of Patent: Feb. 10, 2009

(54) THERMAL MANAGEMENT SYSTEM

(75) Inventors: Takashi Inukai, Kawasaki (JP);
Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 11/698,619

(22) Filed: Jan. 26, 2007

(65) Prior Publication Data
US 2007/0239319 A1 Oct. 11, 2007

(30) Foreign Application Priority Data
Apr. 5, 2006 (JP) ............................. 2006-104327

(51) Int. Cl.
*G06K 1/08* (2006.01)
(52) U.S. Cl. .................. 702/132; 307/651; 702/130
(58) Field of Classification Search .............. 702/99, 702/130, 132; 374/121, 130, 141, 178; 340/501; 307/651
See application file for complete search history.

(56) References Cited
U.S. PATENT DOCUMENTS
6,674,185 B2 * 1/2004 Mizuta ....................... 307/651
6,934,658 B2 * 8/2005 Clabes et al. ................ 702/132
7,340,366 B2 * 3/2008 Aas et al. ..................... 702/130

FOREIGN PATENT DOCUMENTS
JP 2003-149055 A 5/2003

* cited by examiner

*Primary Examiner*—John H Le
(74) *Attorney, Agent, or Firm*—Sprinkle IP Law Group

(57) ABSTRACT

A thermal management system according to an embodiment of the present invention includes first and second thermo sensors embedded in a chip, a trimming control circuit which determines a characteristic of the first thermo sensor based on a trimming value, a nonvolatile memory which stores trimming data relating the characteristic of the first thermo sensor in an initial state and a system controller which provides temperature data to the trimming control circuit, wherein the temperature data relates a chip temperature detected by the second thermo sensor, wherein the trimming control circuit updates the trimming value based on the temperature data and the trimming data.

17 Claims, 5 Drawing Sheets

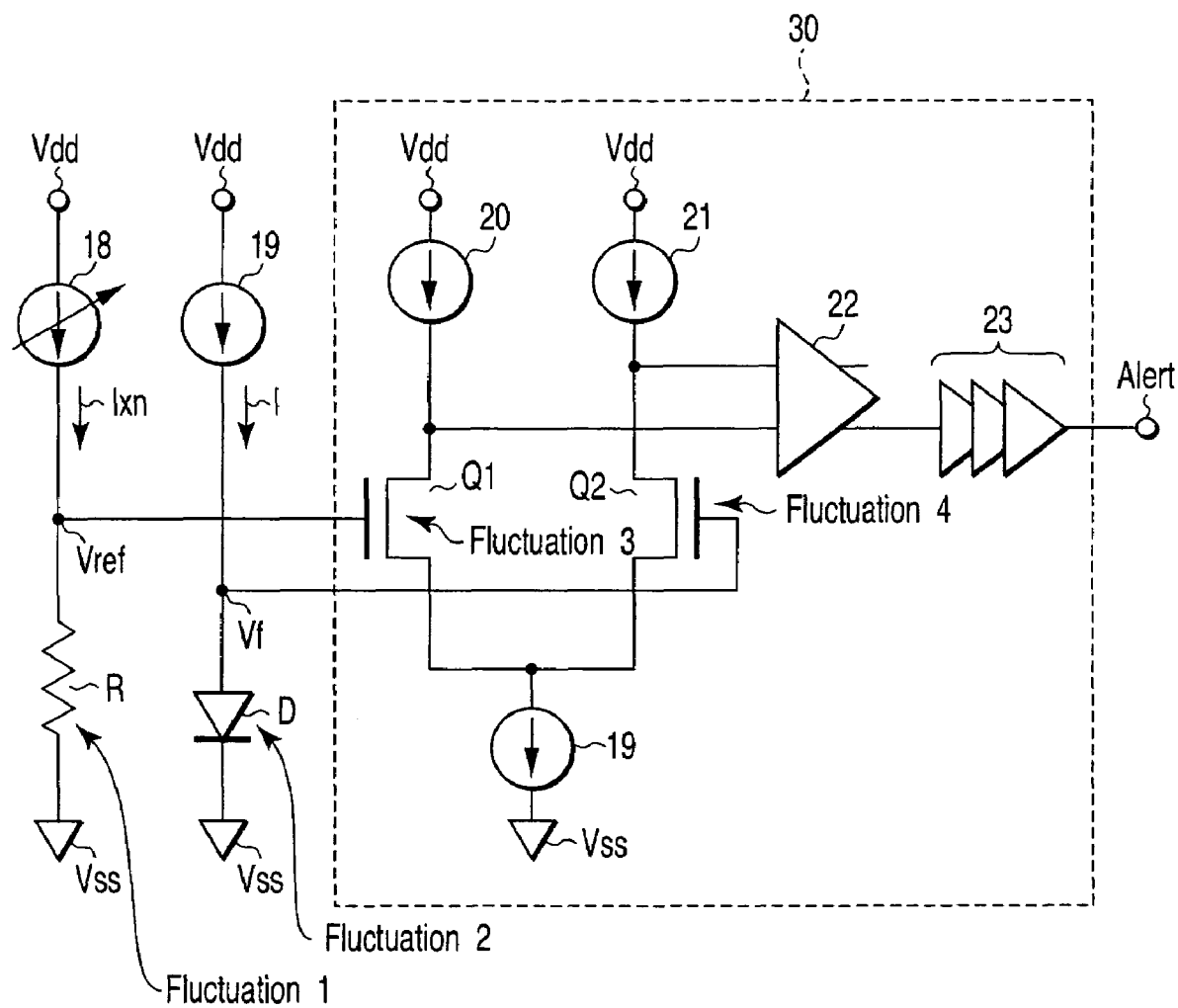
F I G. 3

THERMAL MANAGEMENT SYSTEM

CROSS-REFERENCE TO RELATED APPLICATIONS

This application is based upon and claims the benefit of priority from prior Japanese Patent Application No. 2006-104327, filed Apr. 5, 2006, the entire contents of which are incorporated herein by reference.

BACKGROUND OF THE INVENTION

1. Field of the Invention

The present invention relates to a thermal management system of a semiconductor integrated circuit having an on-chip thermo sensor (thermo sensor embedded in a chip).

2. Description of the Related Art

In a highly sophisticated semiconductor integrated circuit, parallel processing, high speed processing and the like advance, and a rise of a chip temperature caused by such advancement becomes a problem.

When the chip temperature is equal to or greater than a limit, a phenomenon such as a transistor breakage or firing occurs, and thus, there is a need for a technique of preventing such a phenomenon.

As one of the above techniques, there is provided a management technique in which a thermo sensor is embedded in a chip, and when a chip temperature exceeds a predetermined value, a cooling fan is driven, a processing speed is lowered, and further, operation is stopped (refer to, for example, Jpn. Pat. Appln. KOKAI Publication No. 10-41466).

According to this method, calibration of adjusting a predetermined temperature for starting the cooling fan is executed before shipment. In the calibration, a trimming value is determined such that an alert is outputted at the predetermined temperature, and this value is stored in a fuse box.

The chip environment which is the predetermined temperature is created by, for example, a plate, oven, and heat bath, controlled in temperature. To obtain an alert output accurately at the predetermined temperature, self-heating by a leak current in a chip needs to be considered (refer to, for example, Jpn. Pat. Appln. KOKAI Publication No. 2003-149055).

However, if a trimming value determined by calibration before shipment is still continued to be used, an alert is outputted at a temperature other than the predetermined temperature originating from aging characteristics of a thermo sensor, a comparator or the like after shipment.

BRIEF SUMMARY OF THE INVENTION

A thermal management system according to an aspect of the present invention comprises first and second thermo sensors embedded in a chip, a trimming control circuit which determines a characteristic of the first thermo sensor based on a trimming value, a nonvolatile memory which stores trimming data relating the characteristic of the first thermo sensor in an initial state, and a system controller which provides temperature data to the trimming control circuit, wherein the temperature data relates a chip temperature detected by the second thermo sensor, wherein the trimming control circuit updates the trimming value based on the temperature data and the trimming data.

A thermal management system according to an aspect of the present invention comprises first and second thermo sensors embedded in a chip, a trimming control circuit which determines a characteristic of the first thermo sensor based on a trimming value, a nonvolatile memory which stores trimming data relating the characteristic of the first thermo sensor in an initial state, and a system controller which provides temperature data to the trimming control circuit, a system controller which updates the trimming value based on temperature data and the trimming data, wherein the temperature data relates a chip temperature detected by the second thermo sensor, wherein the trimming control circuit receives the trimming value.

A method for updating a trimming value based on a characteristic of a first thermo sensor according to an aspect of the present invention comprising detecting a chip temperature by a second thermo sensor at a preliminarily determined time, estimating an aging characteristic of the first thermo sensor based on temperature data relating the chip temperature and trimming data relating the characteristic of the first thermo sensor in an initial state, and updating the trimming value.

BRIEF DESCRIPTION OF THE SEVERAL VIEWS OF THE DRAWING

FIG. 3 is a circuit diagram showing an example of an alert circuit;

DETAILED DESCRIPTION OF THE INVENTION

Figure 1:
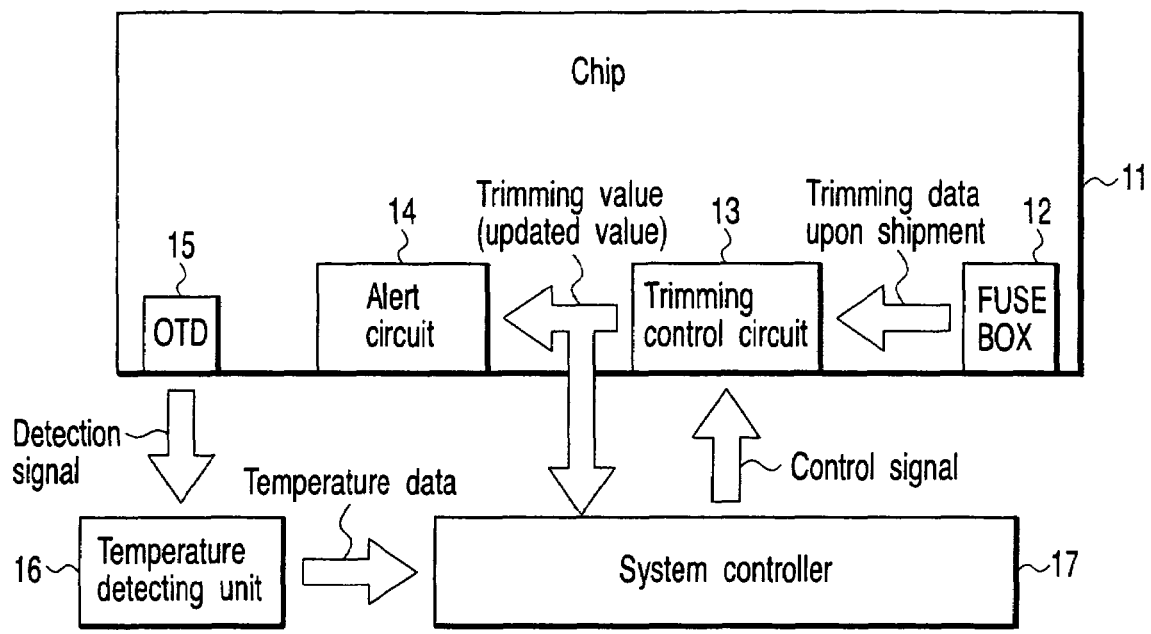
FIG. 1 is a diagram showing a thermal management system according to a first embodiment.

A thermal management system of an aspect of the present invention will be described below in detail with reference to the accompanying drawings.

A thermal management system according to an example of the present invention has a feature in that calibration is executed periodically not only before shipment of a chip but also after shipment.

However, the calibration after shipment cannot adopt a method of creating a predetermined temperature and then adjusting a trimming value such that an alert is outputted at the predetermined temperature unlike before shipment.

Then, according to an example of the present invention, a relational expression for estimating a new trimming value taking characteristic fluctuation after shipment into account is created such that the alert output always occurs at the predetermined temperature after shipment.

The trimming value is periodically updated based on this relational expression.

More specifically,

1. The relational expression is obtained by executing calibration under two temperature conditions before shipment.

The relational expression for estimating the trimming value is obtained as follows.

$$(\text{Trimming value}) = a \times (\text{Chip temperature}) + b \quad (A)$$

Before shipment, $a = a0$ and $b = b0$ are obtained, and these values are stored in a nonvolatile memory such as, for example, a fuse box.

Because an object of this stage is to obtain the relational expression, trimming data does not need to be just the coefficients a0, b0. It is permissible to store data for obtaining the coefficients a0, b0 and cause a chip (or system) to obtain the coefficients a0, b0 based on this data.

2. Calibration and measurement of temperature with an on-chip thermal diode (OTD) are executed after shipment.

Of the coefficients a, b in the relational expression (A), the coefficient b change.

Then, a value of the coefficient b1 at a current stage is calculated from a result of calibration (trimming value) and a chip temperature obtained by measurement with the OTD.

$$b1 = (\text{Trimming value}) - \{a0 \times (\text{Chip temperature})\} \quad (B)$$

The chip temperature is a chip temperature at the time of calibration.

Then, when b1 is not equal to b0, the trimming value is updated based on the following.

$$(\text{Trimming value (updated value)}) = a0 \times (\text{Chip temperature}) + b1 \quad (C)$$

The chip temperature mentioned here is a predetermined temperature at which an alert signal should be outputted.

When b1 is equal to b0, the trimming value does not need to be updated.

In this case, the updated value becomes equal to the previous trimming value, and as a consequence, calculation of the expression (C) is not necessary.

3. Thereafter, calibration and measurement of temperature with the OTD are executed in the same way.

$$\text{A coefficient } b2 \text{ at a current stage is obtained by } b2 = (\text{Trimming value}) - \{a0 \times (\text{Chip temperature})\} \quad (D).$$

The chip temperature is a chip temperature at the time of calibration.

When b2 is not equal to b1, the trimming value is updated based on the following.

$$(\text{Trimming value (updated value)}) = a0 \times (\text{Chip temperature}) + b2 \quad (E)$$

The chip temperature mentioned here is a predetermined temperature at which an alert signal should be outputted.

When b2 is equal to b1, the trimming value does not need to be updated.

According to such a method, the trimming value at a current stage may be obtained by calibration each time or a trimming value obtained by previous calibration may be stored in a nonvolatile memory.

As for the value of the coefficient b (b=b0, b1, b2, . . . ), a value of a previous coefficient b needs to be stored in the nonvolatile memory for the above-described comparison. However, the coefficient b does not need to be stored if the expression (C) or (E) is executed without any comparison instead of this.

The calibration after shipment is preferred to be carried out when the quantity of generated heat in a chip is equalized, for example, at the time of power ON, clock stop or reset.

Such a configuration enables a chip temperature to be always detected accurately by updating a trimming value of a thermo sensor even if characteristic fluctuation of the thermo sensor occurs after shipment of a chip. Consequently, margin taking a detection error of temperature into account can be reduced, thereby reducing a cooling cost.

Now, some embodiments considered to be the best will be described.

First Embodiment

FIG. 1 shows a thermal management system according to a first embodiment.

A chip (semiconductor integrated circuit) 11 is, for example, a micro computer, a processor including a graphics processing unit (GPU) and a central processing unit (CPU), or a high-speed processing device having plural processing units capable of operating independently. The type of the chip 11 is not restricted to any particular one.

A fuse box 12, a trimming control circuit 13, an alert circuit 14 and an OTD 15 are embedded in the chip 11.

The fuse box 12 stores trimming data (data necessary for calibration) of the alert circuit 14 before shipment.

The OTD 15 detects a chip temperature when the quantity of generated heat in the chip is equalized, for example, at the time of power ON, clock stop or reset. That is, the OTD 15 outputs a detection signal relating a chip temperature, and a temperature detecting unit 16 obtains a chip temperature based on the detection signal from the OTD 15 and then supplies the obtained chip temperature to a system controller 17 as temperature data.

The system controller 17 gives the temperature data from the temperature detecting unit 16 to the trimming control circuit 13 as a control signal.

The trimming control circuit 13 estimates characteristic fluctuation of the alert circuit 14 based on a result of calibration at a temperature at that time, a control signal (temperature data) and trimming data of the alert circuit 14 before shipment from the fuse box 12. Then, a new trimming value (updated value) of the alert circuit 14 is determined based on this characteristic fluctuation to update the trimming value.

The trimming value (updated value) is inputted to the alert circuit 14 and at the same time, inputted to the system controller 17.

Although the temperature detecting unit 16 is arranged out of the chip 11 in this embodiment, it may be embedded in the chip 11. Further, it is permissible to provide the same function as the system controller 17 in the chip 11 and omit the system controller 17.

The number of the OTD 15 is not restricted to one but may be plural.

Such a configuration enables the alert circuit 14 to be calibrated periodically even after shipment of the chip. Accordingly, even if the characteristic fluctuation of the thermo sensor occurs after shipment, an accurate chip temperature can be always detected by updating the trimming value of the thermo sensor.

Second Embodiment

Figure 2:
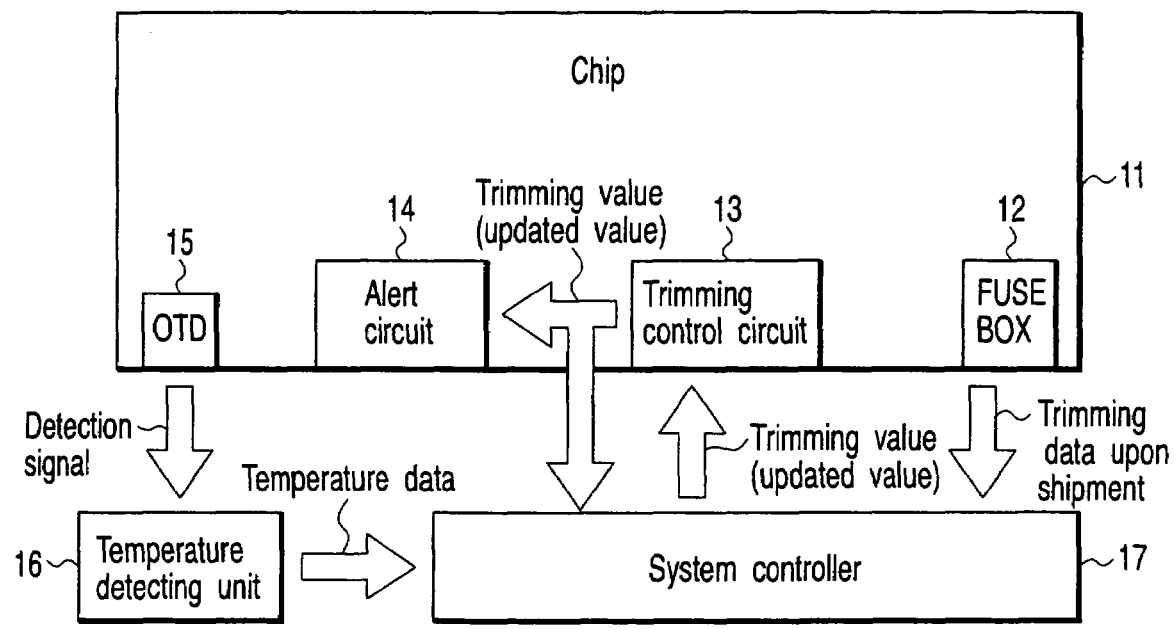
FIG. 2 is a diagram showing a thermal management system according to a second embodiment.

FIG. 2 shows a thermal management system according to a second embodiment.

The type of a chip (semiconductor integrated circuit) 11 is not restricted to any particular one like the first embodiment.

A fuse box 12, a trimming control circuit 13, an alert circuit 14 and an OTD 15 are embedded in the chip 11.

The fuse box 12 stores trimming data (data necessary for calibration) of the alert circuit 14 before shipment.

The OTD 15 detects a chip temperature when the quantity of generated heat in the chip is equalized, for example, at the time of power ON, clock stop or reset. That is, the OTD 15 outputs a detection signal relating a chip temperature, and a temperature detecting unit 16 obtains a chip temperature based on the detection signal from the OTD 15 and then supplies the obtained chip temperature to the system controller 17 as temperature data.

The system controller 17 estimates characteristic fluctuation of the alert circuit 14 based on a result of calibration (trimming value) at a temperature at that time, the temperature data from the temperature detecting unit 16 and the trimming data of the alert circuit 14 before shipment from the fuse box 12, and determines a new trimming value (updated value) of the alert circuit 14 based on this characteristic fluctuation.

The trimming control circuit 13 receives this new trimming value (updated value) from the system controller 17, and actually updates the trimming value to the alert circuit 14.

The trimming value (updated value) is inputted to the alert circuit 14 and at the same time, inputted to the system controller 17.

Although the temperature detecting unit 16 is arranged out of the chip 11 like the first embodiment, it may be embedded in the chip 11. Further, it is permissible to provide the same function as the system controller 11 in the chip 11 and omit the system controller 17.

The number of the OTD 15 is not restricted to one but may be plural.

Such a configuration enables the alert circuit 14 to be calibrated periodically after the shipment of the chip. Accordingly, even if the characteristic fluctuation of the thermo sensor occurs after shipment, an accurate chip temperature can be always detected by updating the trimming value of the thermo sensor.

[Thermo sensor]

An example of the thermo sensor will be described.

FIG. 3 shows an example of an alert circuit as a thermo sensor.

A variable current source 18 generates a current I×n and supplies the current to a resistor (for example, polysilicone resistor, diffused resistor and the like) R. A reference voltage Vref is generated by the variable current source 18 and the resistor R. Trimming of the alert circuit is carried out, for example, by changing the value of the current I×n based on the trimming value.

The variable current source 18 is constituted of, for example, n MOS transistors connected in parallel. In this case, the value of the reference voltage Vref is trimmed by controlling ON/OFF of the n MOS transistors.

A constant current source 19 generates a current I and supplies the current to a diode D. Because the diode D has a threshold (Vf) characteristic dependent of the chip temperature, the quantity of voltage drop changes depending on the chip temperature. Thus, an output voltage Vf corresponding to the chip temperature is generated.

A voltage comparing circuit 30 is constituted of N-channel MOS transistors Q1, Q2, constant current sources 19, 20, 21, a differential amplifier 22 and a buffer 23. The reference voltage Vref is inputted to a gate of the N-channel MOS transistor Q1, and the output voltage Vf is inputted to a gate of the N-channel MOS transistor Q2.

In the meantime, the voltage comparing circuit 30 is merely an example, and it is permissible to use a voltage comparing circuit having other configuration.

Because there is a relation of Vref<Vf if the chip temperature is lower than an alert point, an output signal Alert of the alert circuit turns to "L". Because there is a relation of Vref>Vf if the chip temperature is higher than the alert point, the output signal Alert of the alert circuit turns to "H".

Such an alert circuit enables to detect whether or not the chip temperature exceeds the alert point by comparing the output voltage Vf of the diode D having temperature dependency with the reference voltage Vref having no temperature dependency.

Figure 4:
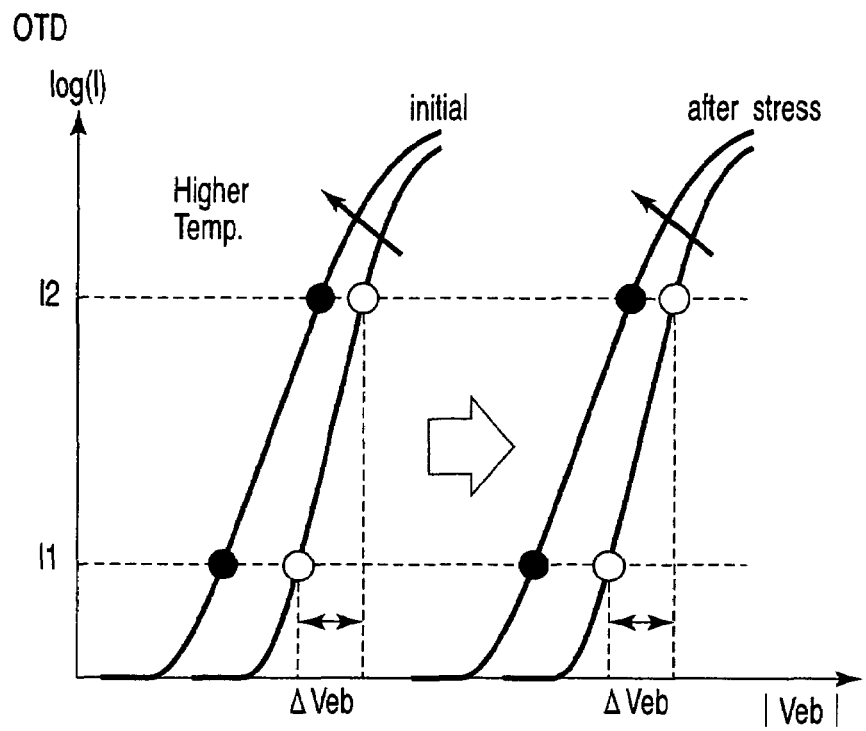
FIG. 4 is a view showing characteristic fluctuation of OTD.
Figure 5:
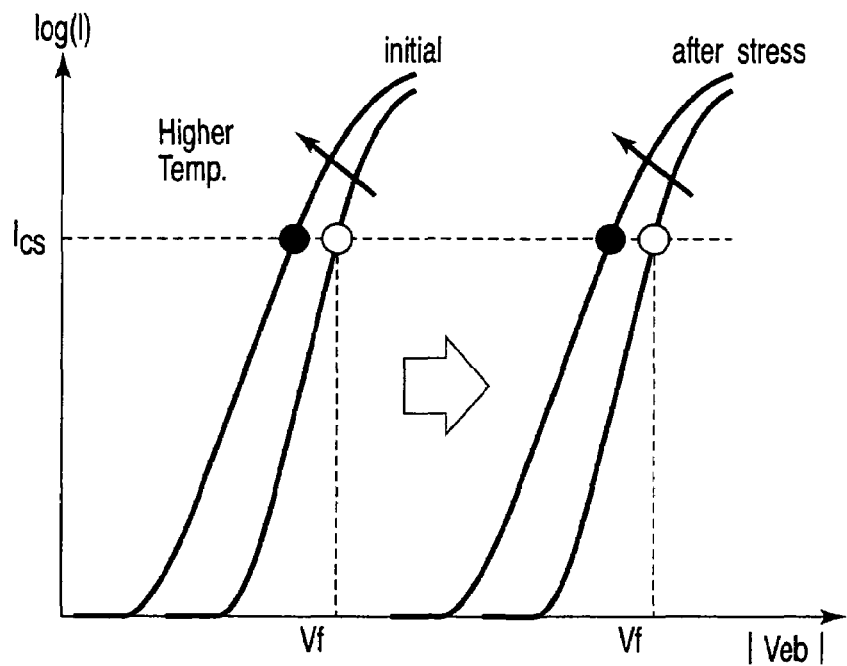
FIG. 5 is a view showing characteristic fluctuation of the alert circuit.

Thermo sensor using the OTD detects a chip temperature by using a voltage difference ΔVeb between two current values I1 and I2 as shown in FIG. 4. Therefore, the characteristic fluctuation of the thermo sensor, that is, the characteristic fluctuation of the thermo sensor between the characteristic in an initial state and a state after a certain time elapses (after stress) is small.

For the reason, the OTD is used to detect the chip temperature necessary for updating of the trimming value according to the embodiment of the present invention.

To the contrary, in case of the thermo sensor using the alert circuit, the characteristic fluctuation of the thermo sensor, namely, the characteristic fluctuation of the thermo sensor between the characteristic in the initial state and a state after a certain time elapses (after stress) is large because it detects the chip temperature by using a voltage value (absolute value) with respect to one current value Ics.

The characteristic fluctuation of the alert circuit depends on the following reasons.

A fluctuation 1 is a characteristic fluctuation accompanying a change in resistance of the resistor R. The reference voltage Vref changes when the resistance of the resistor R changes.

A fluctuation 2 is a characteristic fluctuation accompanying a change in an aging characteristic of the diode D. If the aging characteristic of the diode changes, the relation between the chip temperature and the output voltage Vf in the diode D also changes.

A fluctuation 3 is a characteristic fluctuation generated because the reference voltage Vref is constantly applied to the gate of the N-channel MOS transistor Q1. A fluctuation 4 is a characteristic fluctuation generated because the output voltage Vf is applied to the gate of the N-channel MOS transistor Q1. If an unbalanced stress is applied to a differential pair of the N-channel MOS transistors Q1, Q2, the offset voltage of the differential pair fluctuates.

According to the embodiment of the present invention, even if such a characteristic fluctuation of the thermo sensor occurs after shipment of the chip, an accurate chip temperature can be always detected by updating the trimming value of the thermo sensor.

Even if a thermo sensor having a large change in the aging characteristic after shipment, like an alert circuit is used, a more accurate chip temperature can be detected by using a thermo sensor having a small change in the aging characteristic after shipment like the OTD in combination to compensate for the former with the latter.

In the meantime, a thermo sensor having a large change in the aging characteristic after shipment is not restricted to the alert circuit but likewise, the thermo sensor having a small change in the aging characteristic after shipment is not restricted to the OTD.

[Thermal Management Method]

A thermal management method using the thermal management system of FIG. 1 or 2 will be described.

a. Preparatory Work Before Shipment

Figure 6:
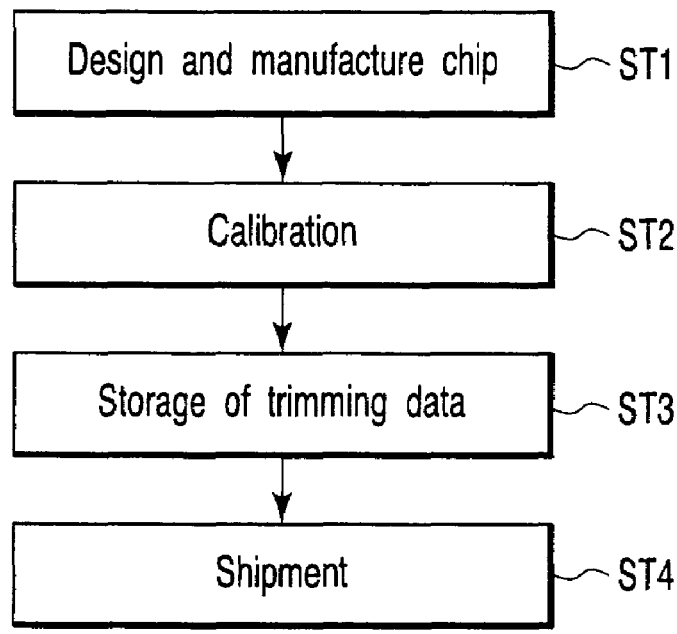
FIG. 6 is a flow chart showing a preparatory work before shipment.

FIG. 6 shows a preparatory work before shipment of a chip.

First, a chip manufacturer designs and manufactures chips (step ST1).

Calibration is executed under two temperature conditions (points A, B) to confirm the characteristic of the thermo sensor, and the characteristic is stored in a nonvolatile memory such as a fuse box as the trimming data (steps ST2 to ST3).

Figure 8:
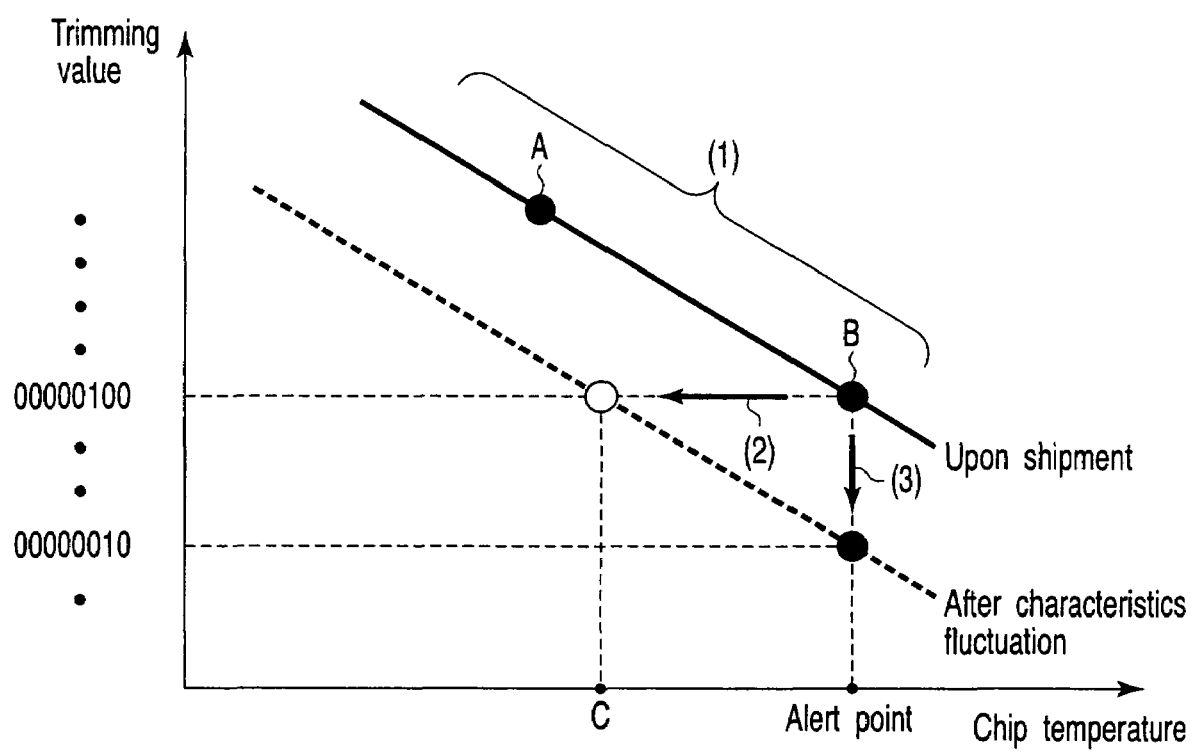
FIG. 8 is a view showing update of a trimming value.

For example, if a trimming value (for example, 8 bits) of the thermo sensor is determined to be "00000100" as shown with a symbol 1 of FIG. 8, the value is stored in the nonvolatile memory. The coefficients a0, b0 of the expression (A) are stored in the nonvolatile memory. However, storage of the trimming value and coefficient b0 into the nonvolatile memory can be omitted by the calibration after shipment.

Thereafter, the shipment of the chips is executed (step ST4).

b. Thermal Management Method After Shipment

Figure 7:
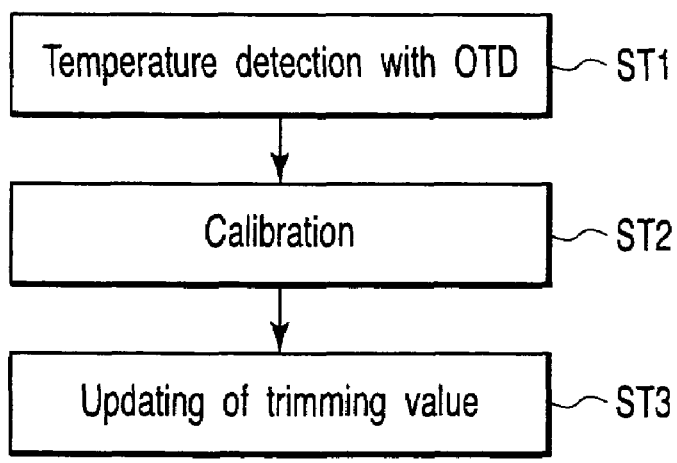
FIG. 7 is a flow chart showing a thermal management method after shipment.

FIG. 7 shows a thermal management method after shipment.

First, a chip temperature is detected by the OTD at a preliminarily determined time or when the quantity of generated heat in the chip is equalized, for example, at the time of power ON, clock stop or resetting (step ST1).

The preliminarily determined time is the same as a preliminarily determined time for obtaining trimming data through a preparatory work before shipment.

The reason why the preliminarily determined time is set to a time when the quantity of generated heat in the chip is equalized is that a difference in temperature between a chip temperature of a portion in which the OTD is arranged and a chip temperature of a portion in which the alert circuit is arranged is preferred to be as small as possible.

Thereafter, the characteristic fluctuation of the alert circuit is estimated based on a result of calibration of the alert circuit (trimming value), the temperature data, and the trimming data of the alert circuit before shipment, and a new trimming value of the alert circuit is determined to update the trimming value (steps ST2 and ST3).

If the trimming value remains to be in the initial state of "00000100" although the characteristic fluctuation of the thermo sensor occurs as shown by an arrow 2 of FIG. 8, the alert point turns to a point C lower than its original value.

Thus, a new trimming value "00000010" is set to update the trimming value such that the alert point is not changed even if the characteristic fluctuation as shown by an arrow 3 in FIG. 8.

In the meantime, the above-described thermal management method is merely an example, and a method for updating the trimming value and data necessary for updating the trimming value are not restricted to any particular ones.

The embodiment of the present invention enables the chip temperature to be always detected accurately even if the characteristic of the thermo sensor changes.

As the fuse box, a laser cut type fuse or electric fuse (E-fuse) may be used.

The nonvolatile memory for storing the trimming data is not restricted to the fuse box, but a semiconductor memory such as a flash memory may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermal management system comprising: first and second thermo sensors embedded in a chip;
   a trimming control circuit which determines a characteristic of the first thermo sensor based on a trimming value;
   a nonvolatile memory which stores trimming data relating the characteristic of the first thermo sensor in an initial state; and
   a system controller which provides temperature data to the trimming control circuit, wherein the temperature data relates a chip temperature detected by the second thermo sensor,
   wherein the trimming control circuit updates the trimming value based on the temperature data and the trimming data, and
   wherein a fluctuation of an aging characteristic of the first thermo sensor is greater than that of the second thermo sensor.

2. The thermal management system according to claim 1, wherein the chip is one selected from a micro computer, a processor and a processing device.

3. The thermal management system according to claim 1, wherein the trimming data includes a relation between the chip temperature at the preliminarily determined time and an alert point.

4. The thermal management system according to claim 3, wherein the preliminarily determined time includes at least one of power ON time, clock stop time and reset time.

5. The thermal management system according to claim 1, wherein the nonvolatile memory is one selected from a fuse and a flash memory.

6. The thermal management system according to claim 1, wherein the trimming control circuit and the nonvolatile memory are embedded in the chip 7. A thermal management system comprising:
   first and second thermo sensors embedded in a chip;
   a trimming control circuit which determines a characteristic of the first thermo sensor based on a trimming value;
   a nonvolatile memory which stores trimming data relating the characteristic of the first thermo sensor in an initial state; and
   a system controller which provides temperature data to the trimming control circuit, said system controller which updates the trimming value based on temperature data and the trimming data,
   wherein the temperature data relates a chip temperature detected by the second thermo sensor,
   wherein the trimming control circuit receives the trimming value, and
   wherein a fluctuation of an aging characteristic of the first thermo sensor is greater than that of the second thermo sensor.

8. The thermal management system according to claim 7, wherein the chip is one selected from a micro computer, a processor, and a processing device.

9. The thermal management system according to claim 7, wherein the trimming data includes a relation between the chip temperature at the preliminarily determined time and an alert point.

10. The thermal management system according to claim 9, wherein the preliminarily determined time includes at least one of power ON time, clock stop time, and reset time.

11. The thermal management system according to claim 7, wherein the nonvolatile memory is one selected from a fuse and a flash memory.

12. The thermal management system according to claim 7, wherein the trimming control circuit and the nonvolatile memory are embedded in the chip.

13. A method for updating a trimming value based on a characteristic of a first thermo sensor comprising:
   detecting a chip temperature by a second thermo sensor at a preliminarily determined time;
   estimating an aging characteristic of the first thermo sensor based on temperature data relating the chip temperature
   wherein a fluctuation of the aging characteristic of the first thermo sensor is greater than that of the second thermo sensor and trimming data relating the characteristic of the first thermo sensor in an initial state; and updating the trimming value.

14. The method according to claim 13, wherein the trimming data is stored in a nonvolatile memory before shipment.

15. The method according to claim 13, wherein the trimming value is updated after shipment.

16. The method according to claim 13, wherein the trimming data includes a relation between the chip temperature at the preliminarily determined time and an alert point.

17. The method according to claim 13, wherein the preliminarily determined time includes at least one of power ON time, clock stop time, and reset time.

* * * * *